| (12) | United States Patent | (10) Patent No.: | US 9,564,872 B2 |
|---|---|---|---|
| | Lin | (45) Date of Patent: | Feb. 7, 2017 |

(54) SPLITTER CIRCUIT AND FRONT-END CIRCUIT

(71) Applicant: HON HAI PRECISION INDUSTRY CO., LTD., New Taipei (TW)

(72) Inventor: Chao-Ho Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/677,416

(22) Filed: Apr. 2, 2015

(65) Prior Publication Data

US 2016/0072470 A1 Mar. 10, 2016

(30) Foreign Application Priority Data

Sep. 9, 2014 (TW) .............. 103131014 A

(51) Int. Cl.
*H03H 7/48* (2006.01)
*H03H 7/46* (2006.01)

(52) U.S. Cl.
CPC .............. *H03H 7/48* (2013.01); *H03H 7/463* (2013.01)

(58) Field of Classification Search
CPC .................. H03H 7/48; H03H 7/463

USPC ......................... 333/100, 124, 132
See application file for complete search history.

(56) References Cited

U.S. PATENT DOCUMENTS

| 5,430,418 | A | 7/1995 | Blodgett | |
|---|---|---|---|---|
| 6,590,472 | B2 * | 7/2003 | Borodulin | ............... H01P 5/187 |
| | | | | 333/115 |
| 8,587,729 | B2 | 11/2013 | Yoshida et al. | |
| 2004/0263283 | A1 | 12/2004 | Ji et al. | |

FOREIGN PATENT DOCUMENTS

| CN | 103597744 A | 2/2014 |
|---|---|---|
| TW | 201338261 A | 9/2013 |

\* cited by examiner

*Primary Examiner* — Robert Pascal
*Assistant Examiner* — Kimberly Glenn
(74) *Attorney, Agent, or Firm* — Zhigang Ma

(57) ABSTRACT

A splitter circuit includes a first branch circuit and a second branch circuit. Each branch circuit includes a capacitor, an inductor and a resistor. A first end of the capacitor is configured to receive RF signals. A first end of the inductor is coupled to a second end of the capacitor. The second end of the inductor is coupled to ground. The resistor is coupled to the second end of the capacitor to output RF signals. The resistor in the first branch circuit and the resistor of the second branch circuit respectively output RF signals to different devices.

5 Claims, 6 Drawing Sheets

SPLITTER CIRCUIT AND FRONT-END CIRCUIT

FIELD

The subject matter herein generally relates to signal processing circuits, more particularly to a splitter circuit and a front-end circuit.

BACKGROUND

In order to split input signals into two parts, there is a two-way splitter circuit usually made of iron materials in a front-end circuit of a set top box.

BRIEF DESCRIPTION OF THE DRAWINGS

Implementations of the present technology will now be described, by way of example only, with reference to the attached figures.

DETAILED DESCRIPTION

Figure 1:
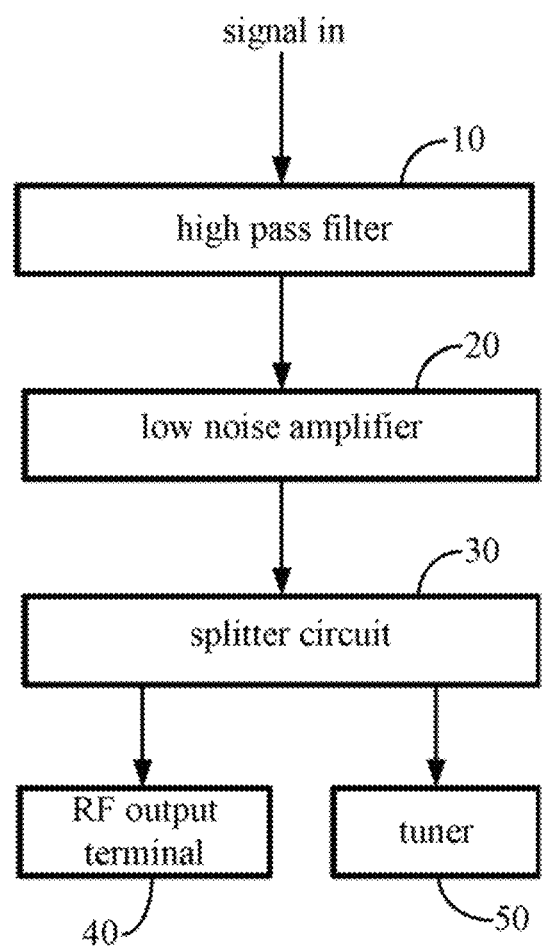
FIG. 1 illustrates a diagrammatic view of one embodiment of a front-end circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to a splitter circuit and a front-end circuit.

FIG. 1 illustrates a diagrammatic view of one embodiment of a front-end circuit. In at least one embodiment, the front-end circuit is configured to process radio frequency (RF) signals. The front-end circuit includes a high pass filter 10, a low noise amplifier 20, a splitter circuit 30, an RF output terminal 40 and a tuner 50. When RF signals are input to the front-end circuit, the RF signals are transmitted to the high pass filter 10, the low noise amplifier 20 and the splitter circuit 30 in sequence. The high pass filter 10 is configured to filter high frequencies from the RF signals. The low noise amplifier 20 is configured to amplify the RF signals before outputting the RF signals to the splitter circuit 30.

The splitter circuit 30 includes a first branch circuit and a second branch circuit. In order to divide the RF signals into two parts, the first branch circuit is coupled to the RF output terminal 40, while the second branch circuit is coupled to the tuner 50. After processing the signal in the splitter circuit 30, one part of the RF signals transmits through the RF output terminal 40, while the other part of the RF signals transmits through the tuner 50. In other embodiments, the RF output terminal 40 or the tuner 50 are parts of other devices, such as a RF input port, signal receiving circuit.

Figure 2:
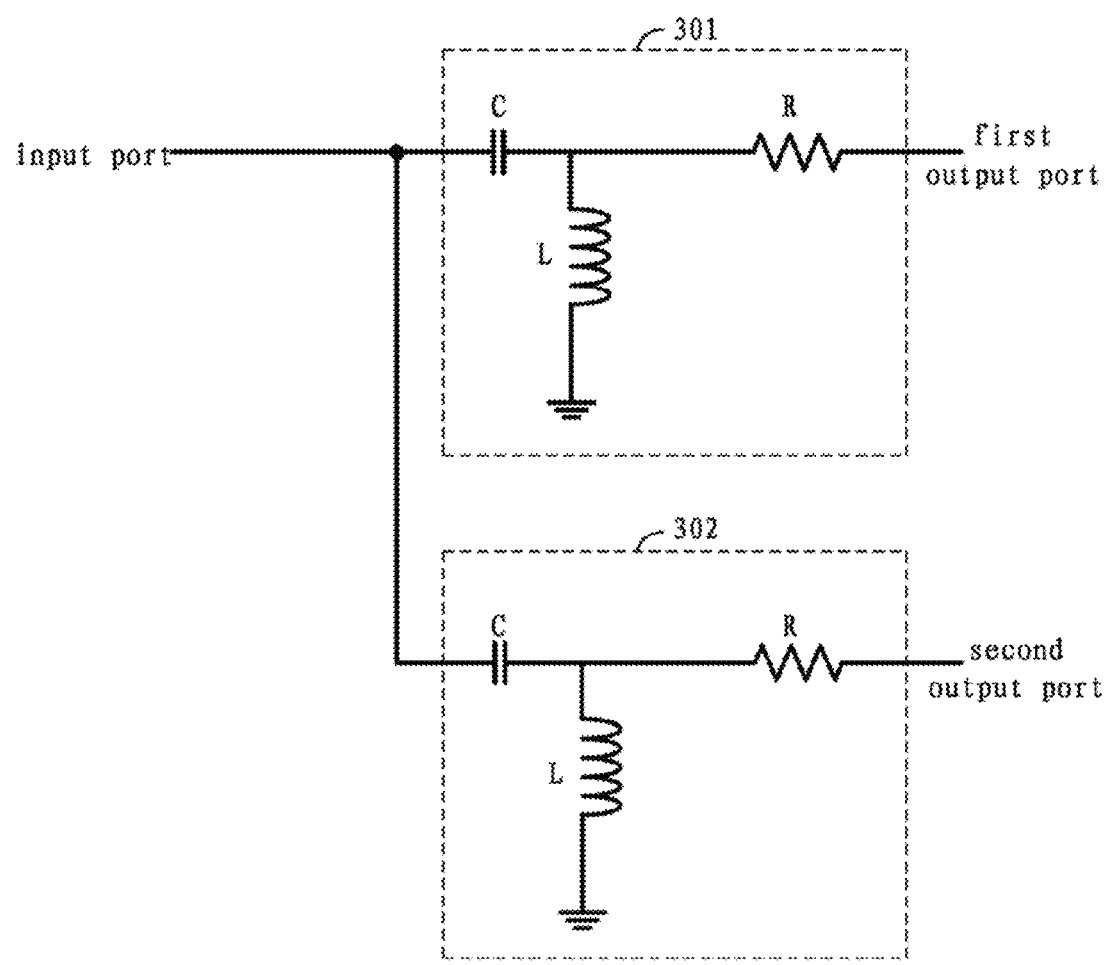
FIG. 2 illustrates a circuit diagram of one embodiment of a splitter circuit.
Figure 3:
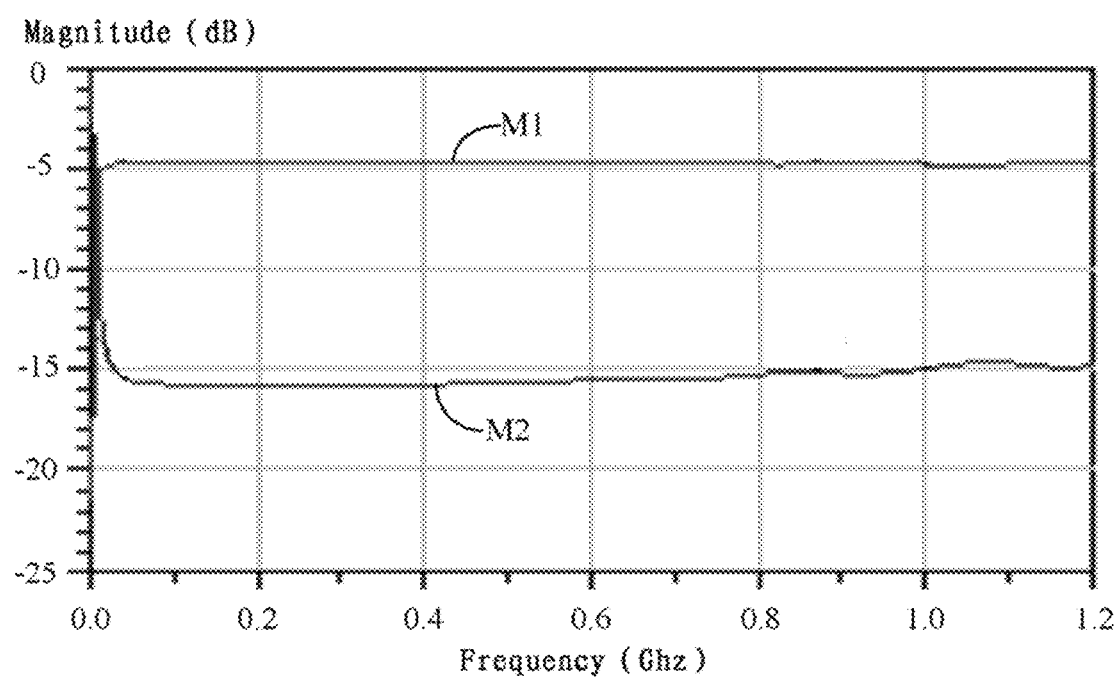
FIG. 3 illustrates a scattering parameter measurement diagram of one embodiment of a splitter circuit.
Figure 4:
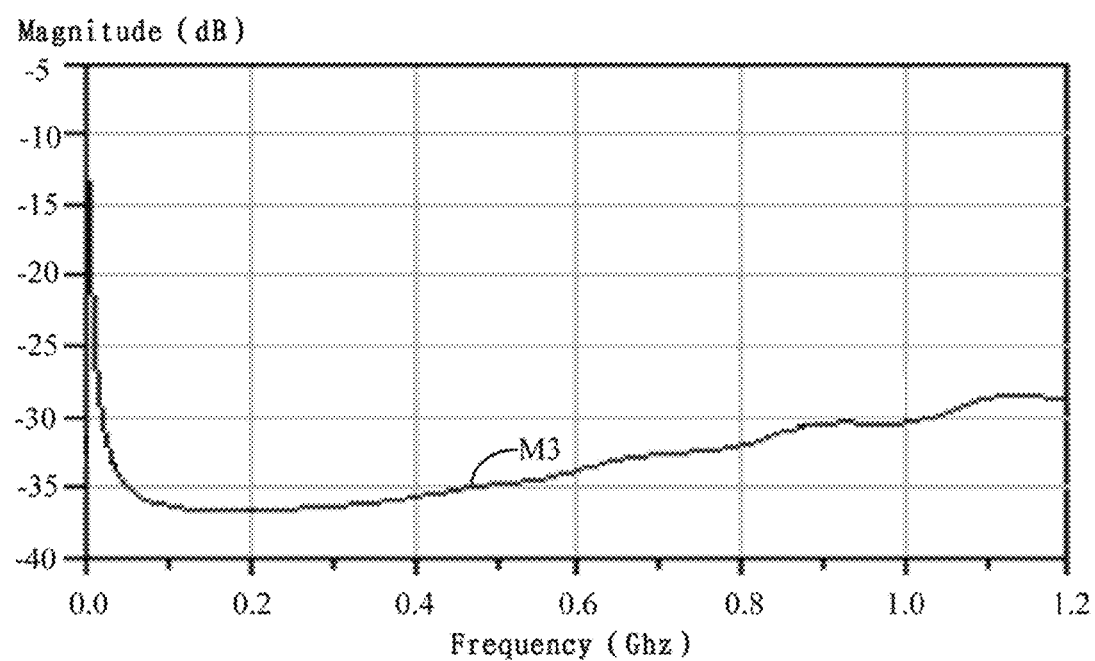
FIG. 4 illustrates a scattering parameter measurement diagram of one embodiment of a splitter circuit.
Figure 5:
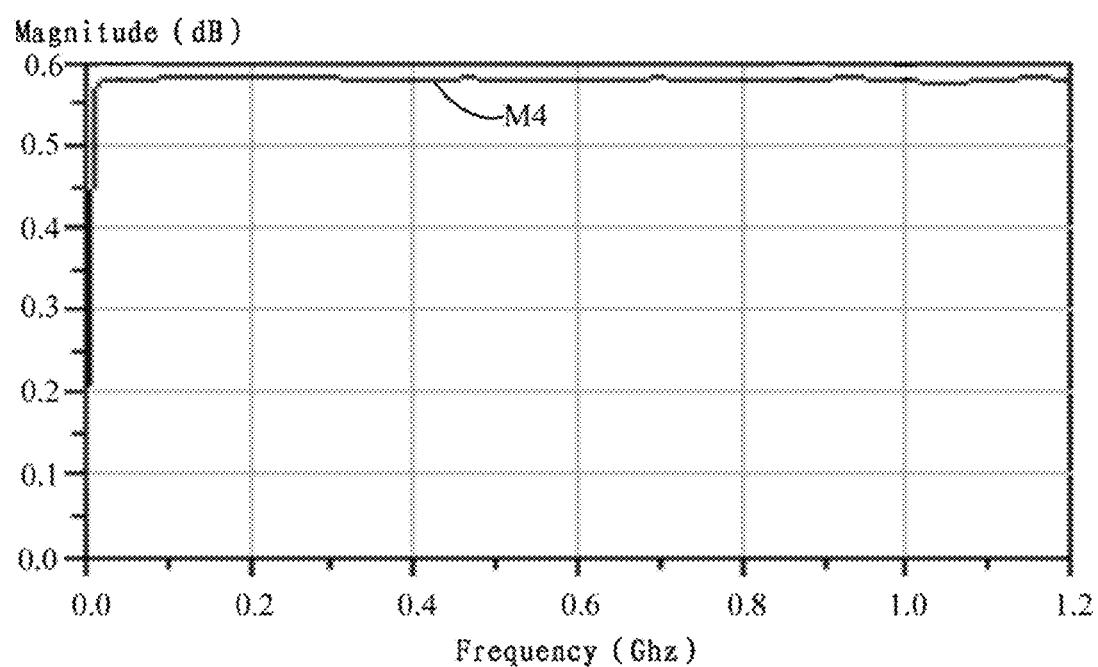
FIG. 5 illustrates a scattering parameter measurement diagram of one embodiment of a splitter circuit.
Figure 6:
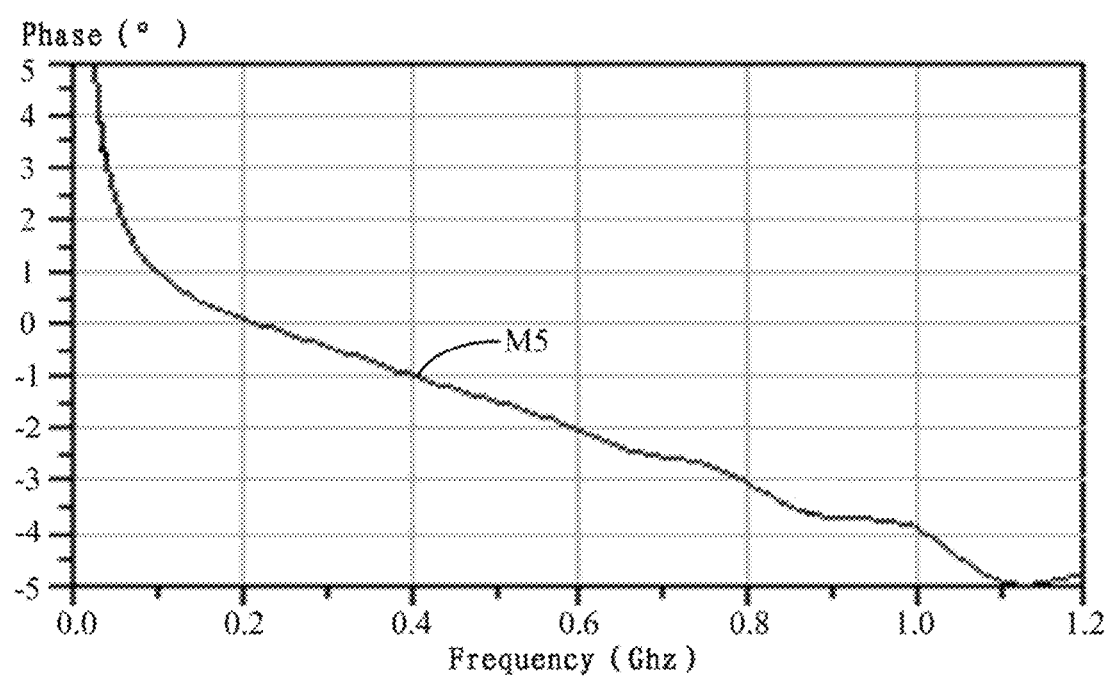
FIG. 6 illustrates a scattering parameter measurement diagram of one embodiment of a splitter circuit.

FIG. 2 illustrates a circuit diagram of one embodiment of a splitter circuit 30. In at least one embodiment, the splitter circuit 30 includes a first branch circuit 301 and a second branch circuit 302.

The first branch circuit 301 and the second branch circuit 302 both include a capacitor C, an inductor L and a resistor R. A first end of the capacitor C is coupled to an input port of each branch circuit to receive RF signals. A first end of the inductor L is coupled to a second end of the capacitor C, while a second end of the inductor L is coupled to ground. A first end of the resistor R is coupled to the second end of the capacitor C to output RF signals, and the second end of the resistor R is coupled to an output port of each branch circuit. The resistor R is configured to isolate RF signals of the output port from RF signals of the input port. Different resistors R in the first branch circuit and the second branch circuit output the RF signals to different devices.

In at least one embodiment, in order to improve a performance of the splitter circuit 30, the capacitor C is a ceramic capacitor, and the inductor L is an inductor with an iron core.

FIGS. 3-6 illustrate scattering parameter measurement diagrams of one embodiment of a splitter circuit 30. A curve M1 (shown in FIG. 3) shows a measurement curve of insertion loss. A curve M2 (shown in FIG. 3) shows a measurement curve of return loss at the input port. A curve M3 (shown in FIG. 4) shows a measurement curve of return loss at the output port. A curve M4 (shown in FIG. 5) shows a measurement curve of amplitude attenuation. A curve M5 (shown in FIG. 6) shows a measurement curve of phase variation. As shown in the curves, the splitter circuit 30 has a good performance.

Many details are often found in the art such as the other features of the splitter circuit and the front-end circuit. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A splitter circuit, comprising:
a first branch circuit and a second branch circuit, wherein the first branch circuit and the second branch circuit respectively comprise:
a capacitor with a first capacitor end configured to receive radio frequency (RF) signals;
an inductor with a first inductor end coupled to a second capacitor end of the capacitor, a second inductor end coupled to ground; and
a resistor coupled to the second capacitor end and configured to output the RF signals;
wherein the first capacitor ends in the first branch circuit and the second branch circuit are connected together to form an input end, the resistors in the first branch circuit and the second branch circuit are configured to output the RF signals to different devices, the first branch circuit and the second branch circuit are configured to divide the RF signals into two-branch signals.

2. The splitter circuit as claimed in claim 1, wherein the first branch circuit first capacitor end and the second branch circuit first capacitor end are directly connected together to form the input end.

3. A front-end circuit, comprising:
a splitter circuit configured to receive RF signals and output the RF signals to different devices;
an RF output terminal; and
a tuner;
wherein the splitter circuit comprising:
a first branch circuit and a second branch circuit, wherein the first branch circuit and the second branch circuit respectively comprise:
a capacitor with a first capacitor end to receive RF signals;
an inductor with a first inductor end coupled to a second capacitor end of the capacitor, a second inductor end coupled to ground; and
a resistor coupled to the second capacitor end to output the RF signals;
wherein the first capacitor ends in the first branch circuit and the second branch circuit are connected together to form an input end, the resistors in the first branch circuit and the second branch circuit are respectively coupled to the RF output terminal and the tuner, the resistors in the first branch circuit and the second branch circuit are configured to respectively output the RF signals to the RF output terminal and the tuner, the first branch circuit and the second branch circuit are configured to divide the RF signals into two-branch signals.

4. The front-end circuit as claimed in claim 3, further comprising:
a high pass filter configured to filter high frequencies from the RF signals; and
a low noise amplifier coupled to the high pass filter and configured to amplify the RF signals before outputting the RF signals to the splitter circuit.

5. The front-end circuit as claimed in claim 3, wherein the first branch circuit first capacitor end and the second branch circuit first capacitor end are directly connected together to form the input end.

* * * * *